United States Patent [19]
Weir

[11] Patent Number: 5,453,783
[45] Date of Patent: Sep. 26, 1995

[54] GENERAL ABSOLUTE VALUE CIRCUIT

[75] Inventor: Michael P. Weir, Ballston Lake, N.Y.

[73] Assignee: Martin Marietta Corporation, Syracuse, N.Y.

[21] Appl. No.: 940,261

[22] Filed: Sep. 2, 1992

[51] Int. Cl.$^6$ .............................. H04N 5/335; H04N 3/14
[52] U.S. Cl. .................. 348/294; 348/297; 348/300; 348/307; 348/302; 257/237; 257/239
[58] Field of Search .......................... 358/213.11, 213.13, 358/213.27; 257/237, 239

[56] References Cited

U.S. PATENT DOCUMENTS

| | | | |
|---|---|---|---|
| 4,164,758 | 8/1979 | Kowal | 348/627 |
| 4,362,956 | 12/1982 | Ogasawara et al. | 307/355 |
| 4,403,299 | 9/1983 | Engeler | 364/824 |
| 4,506,293 | 3/1985 | Hurst, Jr. | 348/630 |
| 4,625,322 | 11/1986 | Tukazaki et al. | 377/58 |
| 5,081,536 | 1/1992 | Tandon et al. | 358/213.31 |

FOREIGN PATENT DOCUMENTS 55-82462 6/1980 Japan .............................. H01L/29/76

OTHER PUBLICATIONS

Applications Manual for Operational Amplifiers for Modelling Measuring Manipulating & Much Else, Philbrick/Nexus Research, 1969, Section II.42.
H. W. Tomlinson et al., "Focal-Plane Processing Algorithm and Architecture for Laser Speckle Interferometry", Proceedings of the SPIE-The International Society of Optical Engineering, vol. 1541, Jul. 24-26, 1991, San Diego, Calif., pp. 178-186.
W. F. Kosonocky et al., "Basic Concepts of Charge-Coupled Devices", RCA Review, vol. 36, Sep. 1975, pp. 566-593.
G. J. Michon et al., "CID Image Sensing", Topics in Applied Physics -Charge-Coupled Devices, vol. 38, Chapter 2, pp. 5-24.

*Primary Examiner*—Michael T. Razavi
*Assistant Examiner*—Bipin Shalwala
*Attorney, Agent, or Firm*—Paul Checkovich; Stephen A. Young

[57] ABSTRACT

A general absolute value circuit for developing a true, symmetric or bipolar, absolute value output signal from an input charge signal, compact enough to be used on a sensor chip incorporated into (or used in combination with) a pixel processor of the type used in imaging and other systems that collect electromagnetic radiation as part of on-chip circuitry, includes a balanced differential amplifier combined with a merged dual shelf transistor structure. The balanced differential amplifier, in response to an input charge signal, drives the merged dual shelf transistor structure which in turn generates the desired true absolute value output signal. Such circuitry may be used in imaging systems to implement focal-plane processing algorithms or may be used for performing a single read true absolute value computation by a pixel processor located on a sensor chip. The merged dual shelf transistor structure enhances performance and speed of the processor in which it is incorporated.

3 Claims, 6 Drawing Sheets

GENERAL ABSOLUTE VALUE CIRCUIT

BACKGROUND OF THE INVENTION

1. Field of the Invention

This invention relates generally to circuitry for developing a true, symmetric or bipolar, absolute value output signal from an input signal arising from, for example, a charge stored in a charge coupled device (CCD) structure. Such circuitry is also referred to hereinafter as a "general absolute value circuit". More particularly, the invention relates to a general absolute value circuit that is compact enough to be used on a sensor chip as part of, or in combination with, a pixel processor. Such processors find application in imaging systems and other systems that collect electromagnetic radiation (EMR), such as light, as part of circuitry included on a sensor chip and designed to improve performance and speed of systems in which they are incorporated.

One aspect of the invention relates specifically to a general absolute value circuit comprised of a balanced differential amplifier combined with a dual shelf transistor structure. The balanced differential amplifier, in response to an input signal, drives the dual shelf transistor structure which in turn generates the desired true absolute value output signal. Such circuitry may, for example, be used in imaging systems to implement focal-plane processing algorithms, and may be more generally used for performing a single read (with respect to stored charge) true absolute value computation by a pixel processor situated on a sensor chip.

Another aspect of the invention relates to an improved shelf transistor structure which may be used to further enhance performance and speed of any system in which the general absolute value circuit of the invention is incorporated.

DESCRIPTION OF THE RELATED ART

Analog rectifying and absolute value circuitry for developing a true, symmetric or bipolar, absolute value output signal, are well known. Such devices are taught, for example, *Applications Manual for Operational Amplifiers for Modelling Measuring Manipulating & Much Else*, Philbrick/Nexus Research, 1969, Section II.42. The known devices are not, however, well suited for use in pixel processors on Sensor chips in conjunction with EMR sensors that form part of an imaging System and/or a non-optics oriented sensing system. The reason is that the prior art devices are more precise than necessary for such applications and take up too much space; i.e., the known devices require the use of several op amps each.

Accordingly, it would be desirable to provide a general absolute value circuit that is suitable for use as part of an on-chip pixel processor in image sensing and other systems that include EMR sensors, and which is compact and exhibits performance characteristics with a degree of precision that is matched to the processing application.

Analog rectifying circuits suitable for use as part of an on chip pixel processor are known; however, the known circuit is implement only a "one-sided" absolute value function. That is, the output signal approaches zero for input signals of one polarity, and is proportional to the input signal for the other polarity.

One such rectifying circuit, suitable for use on a sensor chip as part of a focal plane processing array, is described by Tomlinson et al. in "Focal-Plane Processing Algorithm and Architecture For Laser Speckle Interferometry", *Proceedings of the SPIE—The International Society Of Optical Engineering, Infrared Sensors: Detectors, Electronics, and Signal Processing*, Vol. 1541, (1991), pp. 178–186. This publication, hereby incorporated by reference, teaches a focal plane processing array for laser speckle interferometry, in which CCD structures and pixel processors are used to implement a phase computation algorithm.

The algorithm of Tomlinson et al. requires only the addition, subtraction and rectification (absolute) value of signals from adjacent pixels in an imager comprised of a 32×32 array of analog processing elements which determine the average phase shift of a holographic fringe pattern.

Because the rectifying circuit of Tomlinson et al. implements a "one-sided" absolute value function only, it exhibits one or more of three drawbacks, all of which are described in detail by Tomlinson et al., namely:

1. Sensitivity is low for small signals. That is, the transfer function does not exhibit a sharp change in slope at any point, but instead exhibits a smooth variation. Signals that are small compared to the range of curvature are not significantly altered because to them the circuit appears nearly linear. In many sensing applications, and in particular the application described by Tomlinson et al., the signals are, in fact, this small.

2. Two read operations are required to achieve the bipolar absolutes value required by the system taught in the incorporated reference: one with the signals presented with a positive polarity, and one with the signals reversed in polarity. This takes twice as long as a single read operation.

3. All four pixels of each "cell" (where a cell is defined by Tomlinson et al. as a 2×2 array of pixels together with specialized circuitry to facilitate processing of pixel data by a single processor), contribute their signal charge to a common electrode. This electrode must have a capacitance large enough to store four full-well charges, thus forcing a low sensitivity to the signal since signal voltage=signal charge/capacitance.

Accordingly, and more particularly, it would be desirable to provide a general absolute value circuit that, in addition to being compact and exhibiting performance characteristics matched to the processing application, (1) has a high sensitivity for small input signals when compared to prior art circuitry for generating an absolute value output signal; (2) can develop a bipolar absolute value signal with only a single read operation; and (3) does not require a common electrode having a capacitance large enough to store four full well charges, as required by the one-sided absolute value circuit taught by Tomlinson et al.

The analog rectifying circuit of Tomlinson et al. utilizes CCDs to store the input charge signal and a "fill-and-spill" shelf transistor structure to obtain the aforementioned one-sided absolute value (or magnitude) function output signal. Background information describing the key concepts involved in the operation and design of CCDs including, in particular, a description of the "fill- and-spill" concept associated with shelf transistor structures, is set forth by Kosonocky et al. in "Basic Concepts of Charge Coupled Devices" RCA Review, Volume 36, September, 1975, pp. 566–592, which is hereby incorporated by reference. Such background information is useful in understanding the operating principles of the present invention.

A further problem in the prior art arises with respect to the use of shelf transistors as rectifying elements. The shelf transistor described in the Kosonocky et al. publication and taught as part of the pixel processor described in the Tomlinson et al. publication, has been used to provide an intentional nonlinearity, i.e., to rectify a voltage signal. The nonlinearity arises from the inherent behavior of the device. The mode of operation of the shelf transistor used in the pixel processor described in the Tomlinson et al. publication is as follows: (1) the potentials of the source and gate electrodes are first set; (2) the drain voltage is raised above the gate voltage to fill the source well; (3) the drain voltage is then lowered below the gate voltage to spill excess charge out of the source well, to a level controlled by the gate; (4) the signal voltage is then applied to the source electrode; and finally (5) the current in the drain lead is measured. Such shelf transistor can be employed as a diode except that a diode of this type needs to be recharged between operations. In particular, the drain electrode of the shelf transistor described in the Kosonocky et al. publication and taught as part of the pixel processor described in the Tomlinson et al. publication must be alternately driven and measured. However, it is sometimes difficult to arrange for the desired low noise, high sensitivity readout and high amplitude drive functions in the same circuit.

Accordingly, it would be desirable to provide a shelf transistor structure and drive/readout arrangement that allows separation of the input and output functions constrained to be on the same conductor when prior art shelf transistors are utilized. Furthermore, it would be desirable if such structure and separated drive/readout arrangement could be used, instead of conventional shelf transistors and combined drive/readout arrangements, as part of a general absolute value circuit, particularly for on-chip pixel processing applications.

SUMMARY OF THE INVENTION

One object of the invention is to provide a general absolute value circuit which is suitable for use on a sensor chip to perform pixel processing applications.

Another object of the invention is to provide a pixel processor that cooperates with, or includes, a general absolute value circuit to facilitate on-chip determination of a true, symmetric or bipolar, absolute value signal.

A further object of the invention is to provide a general absolute value circuit that has a high sensitivity for small input signals when compared to prior art circuitry for generating an absolute value output signal.

A still further object of the invention is to provide a general absolute value circuit that can develop a bipolar absolute value signal with only a single read operation.

Yet a further an object of the invention is to provide a general absolute value circuit that does not require a common electrode having a large capacitance (when compared with prior art one-sided absolute value circuits), and which is suitable for use in on-chip pixel processing applications.

Yet another object of the invention is to provide a new shelf transistor structure and drive/readout arrangement that allows separation of the input and output functions previously constrained to be on the same conductor.

Still another object of the invention is to provide an imaging system that includes a general absolute value circuit to implement a focal plane processing algorithm via a pixel processor that is situated on a sensor chip and incorporated in such system.

In one aspect of the invention a balanced differential amplifier is used to drive a dual shelf transistor structure to produce a true, symmetric or bipolar, absolute value function.

More particularly, according to one embodiment of the invention, a general absolute value circuit comprises a balanced differential amplifier responsive to an input charge signal, and a dual shelf transistor structure, coupled to and driven by the balanced differential amplifier, for generating a bipolar absolute value output signal corresponding to the input charge signal. The dual shelf transistor structure produces at its drain electrode the bipolar absolute value output signal.

In another aspect of the invention, a novel shelf transistor structure is contemplated for use in fabricating a high speed/high performance general absolute value circuit. The new shelf transistor structure comprises a diffused region doped to one type polarity (or "diffusion") within a semiconductor substrate, serving as both a source and sink of charge; and first, second and third gates, the second gate being located between the third gate and the first gate, for receiving an input signal, the first gate being situated to shield the second gate from voltage transients on the diffusion, and the third gate being situated to establish a reservoir of charge for developing an output signal corresponding to the magnitude of the input signal. In this embodiment of the invention, the bipolar absolute value output signal appears at the third gate of the transistor structure, and the shelf transistor structure has the ability to separate input and output functions as compared with conventional shelf transistor structures which require the input and output functions to be performed on a single conductor.

Other aspects of the invention include use of the novel general absolute value circuitry, independent of the type of shelf transistor structure and drive/readout circuitry utilized to fabricate the circuit, in pixel processors generally, and in imaging systems in particular.

The invention features a general absolute value circuit for obtaining a true, symmetric or bipolar, output signal from an input charge signal, requiring only a single read of the input signal. The circuitry is suitable for use as part of a pixel processor incorporated in an imaging system or, more generally, for use on-chip in EMR sensor circuitry. The general absolute value circuit is compact and sensitive enough to be used on-chip, eliminating the prior art need to perform off-chip calculations to obtain a true absolute value reading. Furthermore, the absolute value circuit can be implemented by well-known shelf transistor structures or by the novel shelf transistor structure of the invention in high speed/high performance applications in which it is desirable to separate the drive and readout structures associated with the transistor structure.

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION

Figure 1:
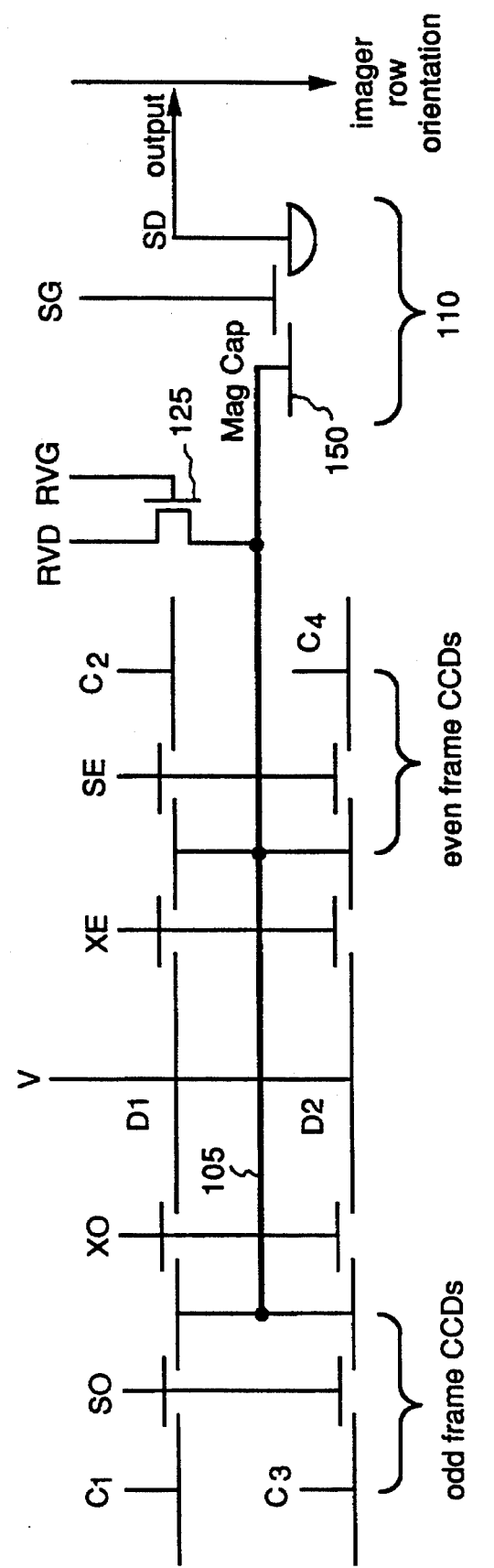
FIG. 1 schematically depicts a prior art charge coupled analog processor that may be used in an exemplary imaging system, such as that in the aforementioned Tomlinson et al. publication, and uses a shelf gate transistor structure for computing a one-sided absolute value function.

FIG. 1 is an example of prior art circuitry for computing a one-sided absolute value function using a shelf gate transistor structure. The exemplary structure is described in the incorporated Tomlinson et al. publication as a pixel processor for use in conjunction with an imager that includes a focal plane processing array.

The Tomlinson et al. paper teaches a phase shift detection algorithm useful in computing the average phase shift of the fringe pattern which occurs between two exposures of the imager. The algorithm requires that the following expressions be computed on the focal plane:

$$\sum_{y=1}^{R} \sum_{x=1}^{C} |(I_n(x,y) - I_n(x+1,y)) + \quad (I)$$

$$(I_{n+1}(x,y) - I_{n+1}(x+1,y))|$$

$$\sum_{y=1}^{R} \sum_{x=1}^{C} |(I_n(x,y) - I_n(x+1,y)) - \quad (II)$$

$$(I_{n+1}(x,y) - I_{n+1}(x+1,y))|,$$

where:

$I_n(x,y)$ is the signal at pixel x,y from imager exposure n;

$I_{n+1}(x,y)$ is the signal at pixel x,y from imager exposure n+1;

x is the pixel index across an imager row;

y is the pixel index across an imager column;

C is the number of pixels in a row−1; and

R is the number of rows.

The pixel processor is implemented primarily with charge-transfer devices, i.e., CCDs, as shown in FIG. 1. The common convention in schematically illustrating CCDs, where lines represent electrodes and coupling between them is represented by their overlap, is used in FIG. 1.

At each processor, such as that depicted in FIG. 1, structures D1 and D2, connected to bias voltage V, store photo-generated charge from two adjacent pixels along a row of the array. Transfer gates XE and XO allow the charge to be shifted left or right into two "odd" frame and two "even" frame CCD structures. The presence of two available charge storage regions allows the storage and processing of signals from successive imager exposures between which the reference beam phase has been shifted by $\pi/2$. This also allows the integration of photo-generated charge to occur in parallel with the analog computation.

Once in the CCDs, charge can be moved to and from the four "clock" electrodes C1, C2, C3 and C4 through the even and odd screen electrodes SE and SO, respectively. These screen electrodes provide shielding between the row and clock electrodes to reduce coupling from the large clock drive voltages to the sensitive row 105. Eventually, the charges can be disposed of by removing the potential from desired CCD electrodes. The charge is then collected by the junction of the epitaxial layer and substrate, as taught by Michon et al. in *Topics in Applied Physics*, Volume 38, Chapter 2, "Charge Coupled Devices".

The charge transfer operations are used to compute sums and differences of the charge packets, and a charge rectifier function is implemented with a fill-and-spill transistor structure 110, as shown in FIG. 1. The output signal provided by fill-and-spill structure 110 is a transient current at terminal SD. The SD terminal of each processor is connected to a common bus, allowing summation of all processor output signals in parallel.

To allow computation of expressions (I) and (II), the four CCDs are connected by a common electrode 105 whose initial potential is set by a reset transistor 125. Also connected to electrode 105 is fill-and-spill transistor structure 110 for obtaining the one-sided absolute value, i.e. magnitude, function.

Initially, charge representing $I_n(x,y)$, $I_n(x+1,y)$, $I_{n+1}(x,y)$, and $I_{n+1}(x+1,y)$ is stored in the CCDs controlled by clock electrodes C1, C3, C2, and C4 respectively. The charge is stored in the semiconductor body either under a clock electrode or under electrode 105, depending on the expression to be calculated (i.e., whether it is to be added or subtracted).

The potential on electrode 105 is then set to its operating point through reset transistor 125, gate RVG of transistor 125 is next disabled to allow electrode 105 to float, and a fill-and-spill operation is next performed to place charge under the magnitude capacitor (or Mag Cap) 150. The aforementioned clock and screen electrodes C1, C2, C3, C4, SO and SE, are then driven to transfer charge either toward or away from electrode 105, resulting in a voltage change on magnitude capacitor 150.

Figure 2:
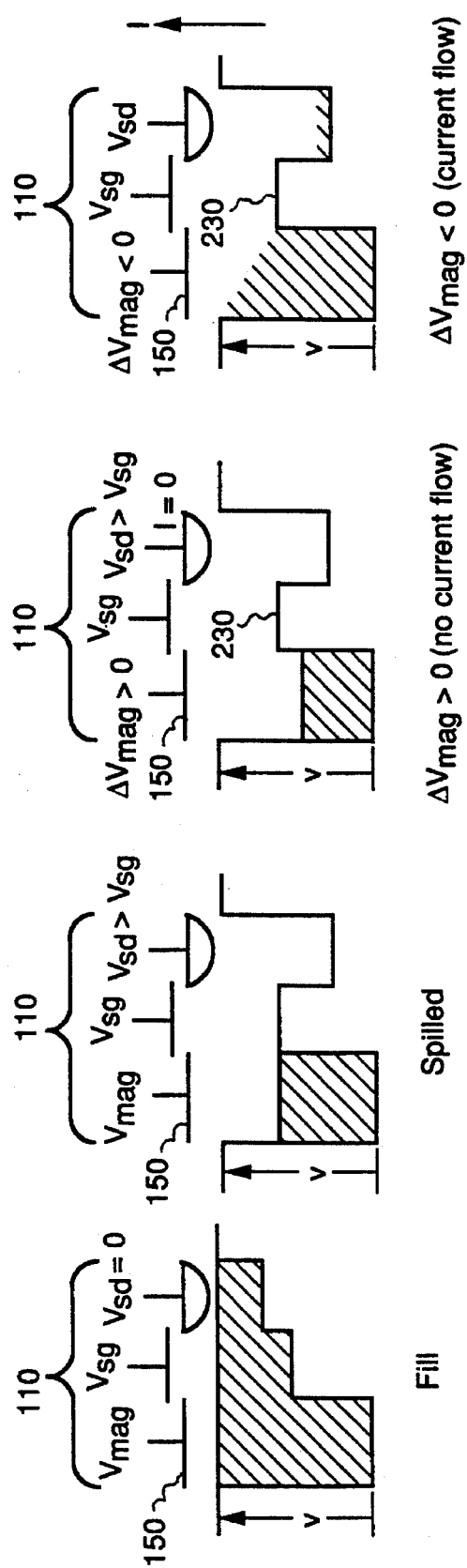
FIGS. 2A–2D are potential/charge diagrams for the shelf transistor structure used to compute the one-sided absolute value function in the prior art analog processor depicted in FIG. 1.

FIGS. 2A–2D depict potential/charge diagrams for the shelf transistor structure used to compute the aforementioned one-Sided absolute value function in the exemplary priori art imaging system depicted in FIG. 1. The charge is represented by the crosshatched areas. Using a CCD representation for the shelf transistor (i.e. fill-and-spill transistor structure 110), it can be seen from FIG. 2C that increases in magnitude capacitor 150 voltage ($\Delta V_{mag} > 0$) will result in no charge flow into the drain region of transistor structure 110, while decreases in magnitude capacitor 150 voltage ($\Delta V_{mag} > 0$) will cause charge to flow over the potential barrier 230 set by voltage $V_{sg}$ applied to terminal SG to result in a one-sided absolute value function (i.e., current rectification), as illustrated in FIG. 2D. The voltage $V_{SG}$ is selected to achieve the relative potentials shown in FIGS. 2A through 2D.

FIG. 2A and FIG. 2B are presented only for the sake of completeness to illustrate the fill-and-spill operation of device structure 110, well known to those skilled in the art and described in the previously referenced Kosonocky et al. publication.

Since the prior art circuitry depicted in FIG. 1 is capable of evaluating only a one-sided absolute value function, two readings of pixel data are required to obtain "both halves" of a true absolute value function. Using the exemplary prior art circuitry depicted in FIG. 1 to obtain the other half of the absolute value function, the readout sequence is repeated but with the CCD charge transferred in the opposite direction. The output signals resulting from these two readouts are summed off-chip to complete the evaluation of the desired expression.

Figure 3:
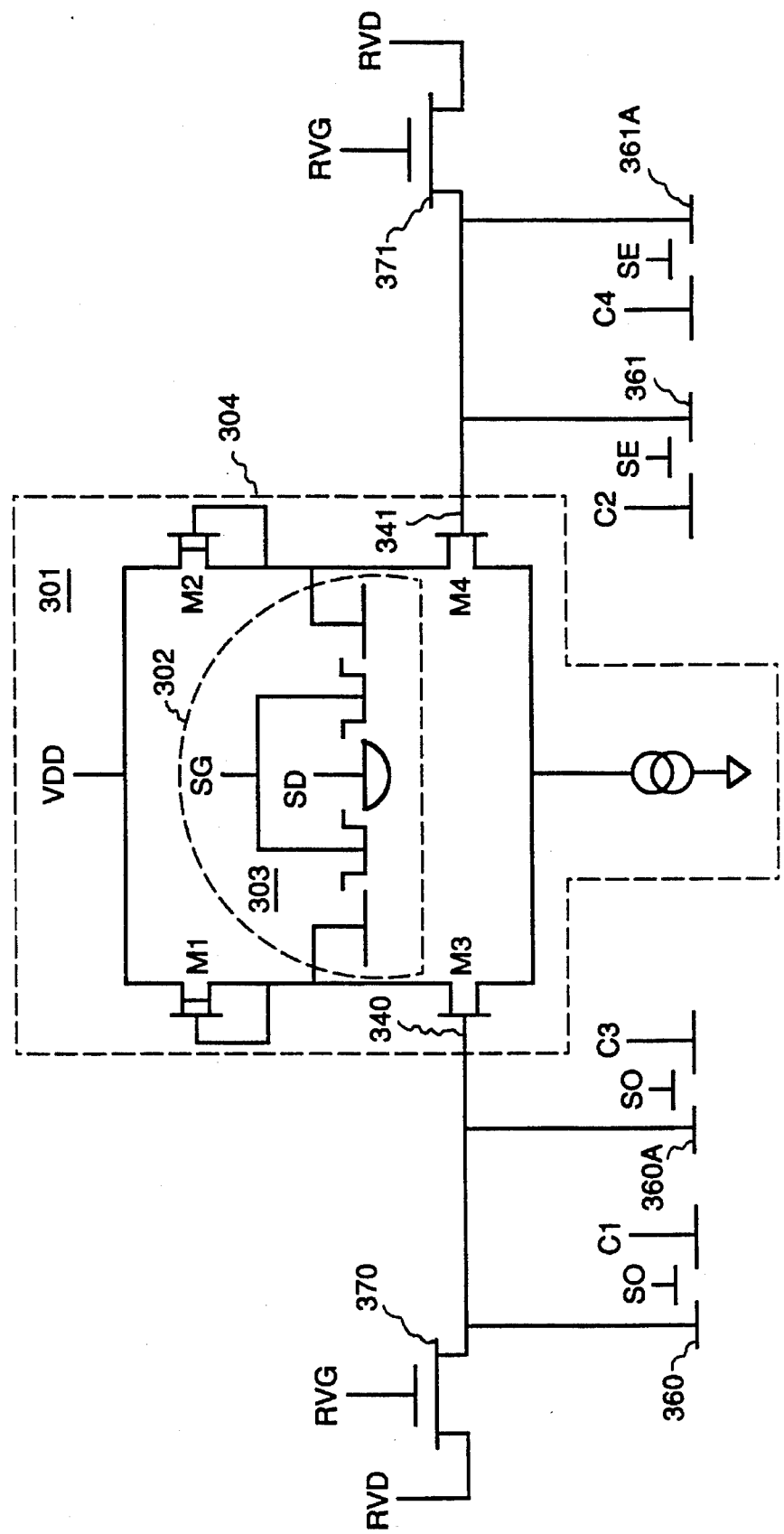
FIG. 3 schematically depicts one embodiment of the general absolutes value circuit contemplated by the present invention.

One embodiment of the general absolute value circuit contemplated by the present invention is depicted in FIG. 3 and utilizes a simple balanced differential amplifier at each cell (4 pixels per cell). In particular, the apparatus between the two sets of dashed lines 302 and 304 comprises a balanced differential amplifier 301, where M3 and M4 are the amplifying transistors, connected in series with depletion load devices M1 and M2, and connected to a merged dual shelf transistor structure 303 situated within dashed line 302. Electrodes SG and SD are the shelf gate and shelf drain electrodes, respectively, of the merged dual shelf transistor structure (i.e., two shelf transistor structures sharing a common drain), functioning as previously described with reference to the fill-and-spill structure depicted in FIGS. 1 and 2A–2D.

As shown in FIGS. 3, the two inputs to balanced differential amplifier 301, shown as gates 340 and 341 of transistors M3 and M4, respectively, are connected to electrodes 360, 360A, and 361 and 361A, respectively. These electrodes have their potentials set by reset transistors=370 and 371, respectively, in the same manner by which the potential on electrode 105 of the processor of FIG. 1 is set by reset transistor 125 thereof.

The two inputs 340 and 341 are driven by only two electrodes each. Thus the sensitivity to signal charge is approximately doubled compared with the prior art approach of adding signals from four clock electrodes. Furthermore, the amplifier provides both the desired four-electrode signal and its negative, so that the merged double shelf transistor can yield, at its drain, the true absolute value of the signal. Among the advantages of the arrangement are:

1. The signal is amplified so that the desired nonlinearity is obtained.
2. The sensitivity, measured at the input node(s) of the amplifier is nearly double that of a system using one, single-ended amplifier.
3. The absolute value of the signal can be obtained in one read operation instead of two.
4. The balance of the differential amplifier is not particularly critical because the fill-and-spill sequence used to prepare the shelf transistor for operation acts rather like a restore circuit. The charge under the two shelf transistor "sources" will adjust itself to compensate for unequal voltages at the amplifier's outputs.

The circuit depicted in FIG. 3 may be used to perform full wave rectification and thereby determine true absolute value with a single read of pixel data. Moreover, the circuit is suitable for incorporation onto a sensor chip as part of a pixel processing array and if used, for example, as part of a focal plane processing array in an imaging system, improves speed and performance of the system because of these features.

Figure 4:
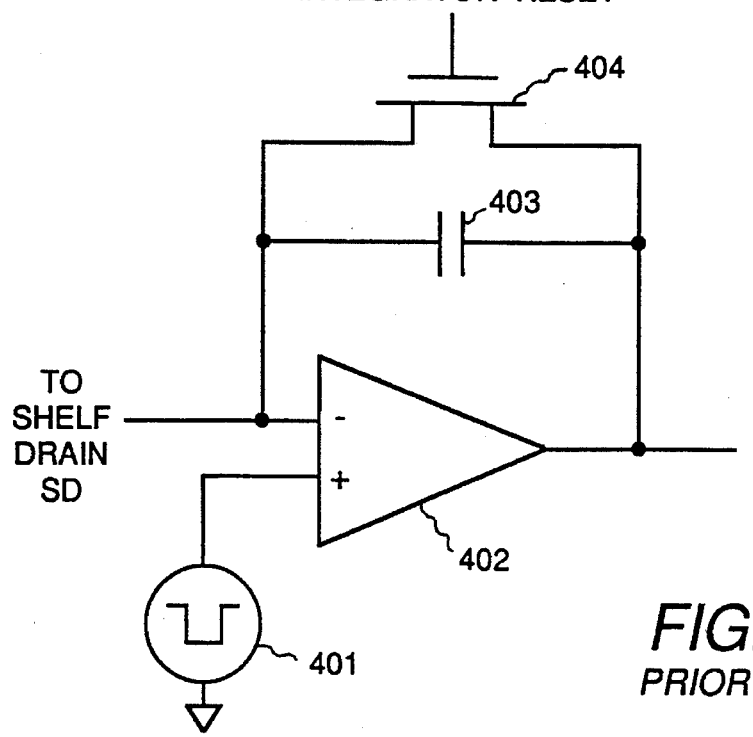
FIG. 4 is a schematic diagram of a prior art resettable integrator utilized as an active feedback drive/sense readout circuit for a shelf transistor structure.
Figure 5:
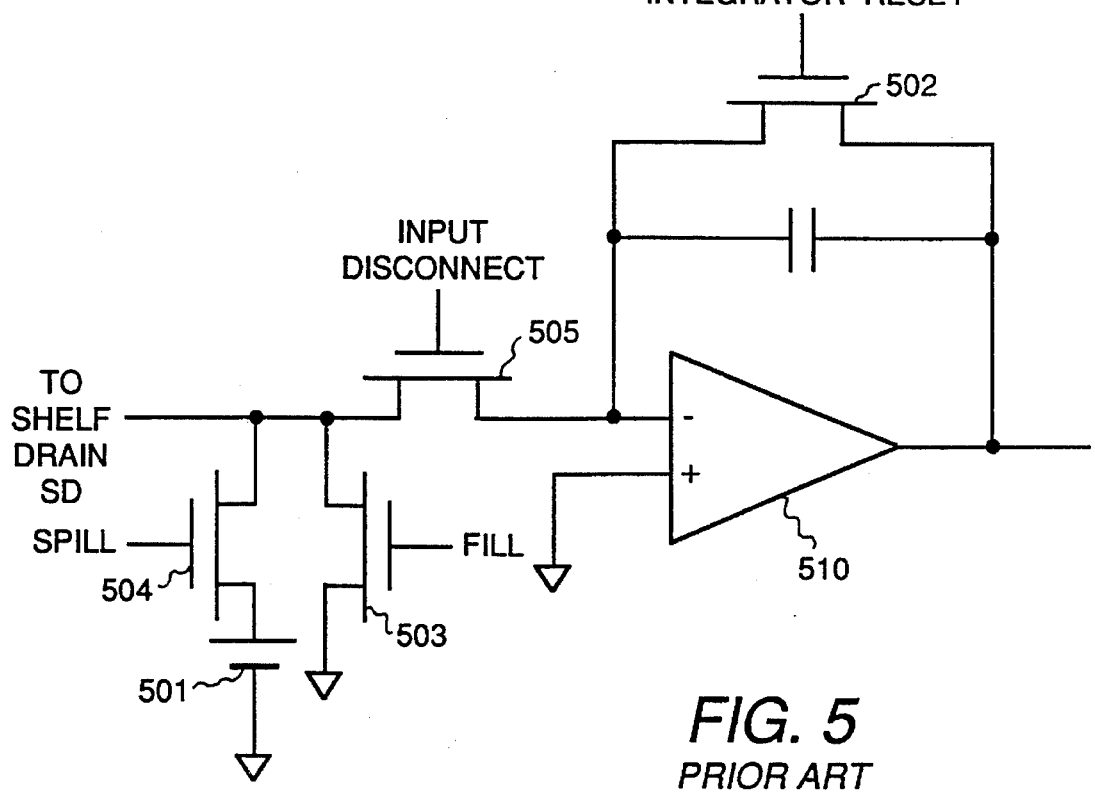
FIG. 5 is a schematic diagram of a prior art resettable integrator utilized as a switched drive/sense readout circuit for a shelf transistor structure.

The merged dual shelf transistor structure depicted in FIG. 3 provides a bipolar absolute value output signal at drain electrode SD. Furthermore, the drain electrode has to be alternately driven, then measured, so that the merged dual shelf transistor structure can be driven or "recharged" between reads. FIGS. 4 and 5 illustrate prior art circuits for performing the combined drive/read measurement function. More particularly, FIG. 4 illustrates a prior art resettable integrator utilized as an active feedback drive/sense circuit for a shelf transistor structure while FIG. 5 illustrates a prior art resettable integrator utilized as a switched drive/sense circuit for a shelf transistor structure.

Operation of the prior art circuits depicted in FIGS. 4 and 5 is described herein for the sake of completeness, and to facilitate a comparison between these circuits and the circuitry contemplated by the aspect of the invention which is directed to the separation of these functions.

The circuit of FIG. 4 is a resettable integrator employing a high gain amplifier 402 with a feedback capacitor 403. A pulsed voltage source 401 is coupled to the positive input of the amplifier. Transistor 404, coupled in parallel with capacitor 403, functions as an integrator reset switch controlled by an externally-generated signal.

The circuit of FIG. 4 is used in two ways:

(1) As an integrator, in which case it converts the transient current from the sensor when the clock electrodes are switched to develop expressions (I) and (II), supra, into a voltage for subsequent use. The integrator thus converts a quantity of charge into a voltage at its output, the charge resulting from the transient current integrated over its duration.

The circuit may be used in this manner during each readout cycle.

(2) As a reset device for resetting the sensor prior to each readout cycle by closing the reset switch (i.e., turning on transistor 404) and pulsing voltage source 401 from its usual nonzero value (assumed for the sake of illustration to be positive) to zero, and then back to its usual value. Amplifier 402, with transistor 404 conducting (i.e., with the reset switch being closed), forces its negative input to follow its positive input. Since this negative input is permanently wired to the sensor output (i.e., the shelf transistor drain in the prior art circuitry shown in FIG. 1), the shelf drain electrode must follow the voltage of pulsed voltage source 401. This accomplishes the desired reset function. The potential well at the shelf transistor drain is collapsed to fill the well under the shelf transistor source, then reestablished to allow the excess charge to spill over the gate and set up the conditions previously described herein. The circuit shown in FIG. 4 requires that the amplifier be fast (i.e., have wide bandwidth) in order to follow the waveshape commanded by pulsed voltage source 401. Wideband amplifiers, however, are inherently noisier than narrowband amplifiers, given similar technology, and noise is detrimental in the applications contemplated for the general absolute value circuit of the invention.

The circuit shown in FIG. 5 is also a resettable integrator, operating under control of transistor switches at its input. A transistor 502 acts as the reset switch. In the implementations of FIGS. 4 and 5, the reset switch is employed to establish a "zero" voltage signal for the integrator before a read operation is performed. The result of the charge addition and subtraction manifests itself as a change in voltage on the focal plane array row bus. Once the integrator has been reset, the array row bus voltage change is generated and the integrator output signal is measured to again to determine the answer.

Transistor 503 in the circuit of FIG. 5 acts as a fill switch. When conductive, it applies zero volts (ground) to shelf transistor drain SD, filling the shelf transistor source well as before. Transistor 504 acts as a spill switch; when conductive, it applies the usual operating voltage to the shelf transistor drain, allowing the excess charge to spill over the gate. Transistors 504 and 503 of FIG. 5 are not conductive simultaneously, thus protecting against inadvertently shorting out the fixed DC voltage supply (shown as a battery 501). Transistor 505 in the input circuit to the negative input terminal of high gain amplifier 510 functions to disconnect the integrator from the sensor (i.e., the shelf transistor drain) while transistors 504 and 503 are forcing the shelf transistor drain to the desired voltages, thus protecting high gain amplifier 510 against damage from subjection to these voltage levels.

Compared to the circuit of FIG. 4, the circuit of FIG. 5 employs additional circuitry at the sensor output. This added Circuitry not only constitutes an additional path for noise to enter the system but also adds capacitance at the negative input terminal to amplifier 510 which also can result in higher noise in the system.

In view of the limitations and drawbacks inherent in the prior art drive/readout circuits discussed hereinabove, it would be desirable to provide a shelf transistor structure and drive/readout circuit that allows separation of the input and output functions previously constrained to be on the same conductor when prior art shelf transistors are utilized. Furthermore, it would be desirable if such shelf transistor structure and drive/readout circuit were usable with the merged dual shelf transistor structures contemplated for use as part of general absolute value circuits, as taught hereinabove, so as to constitute a high speed/high performance general absolute value circuit particularly well suited for on-chip pixel processing applications.

Figure 6:
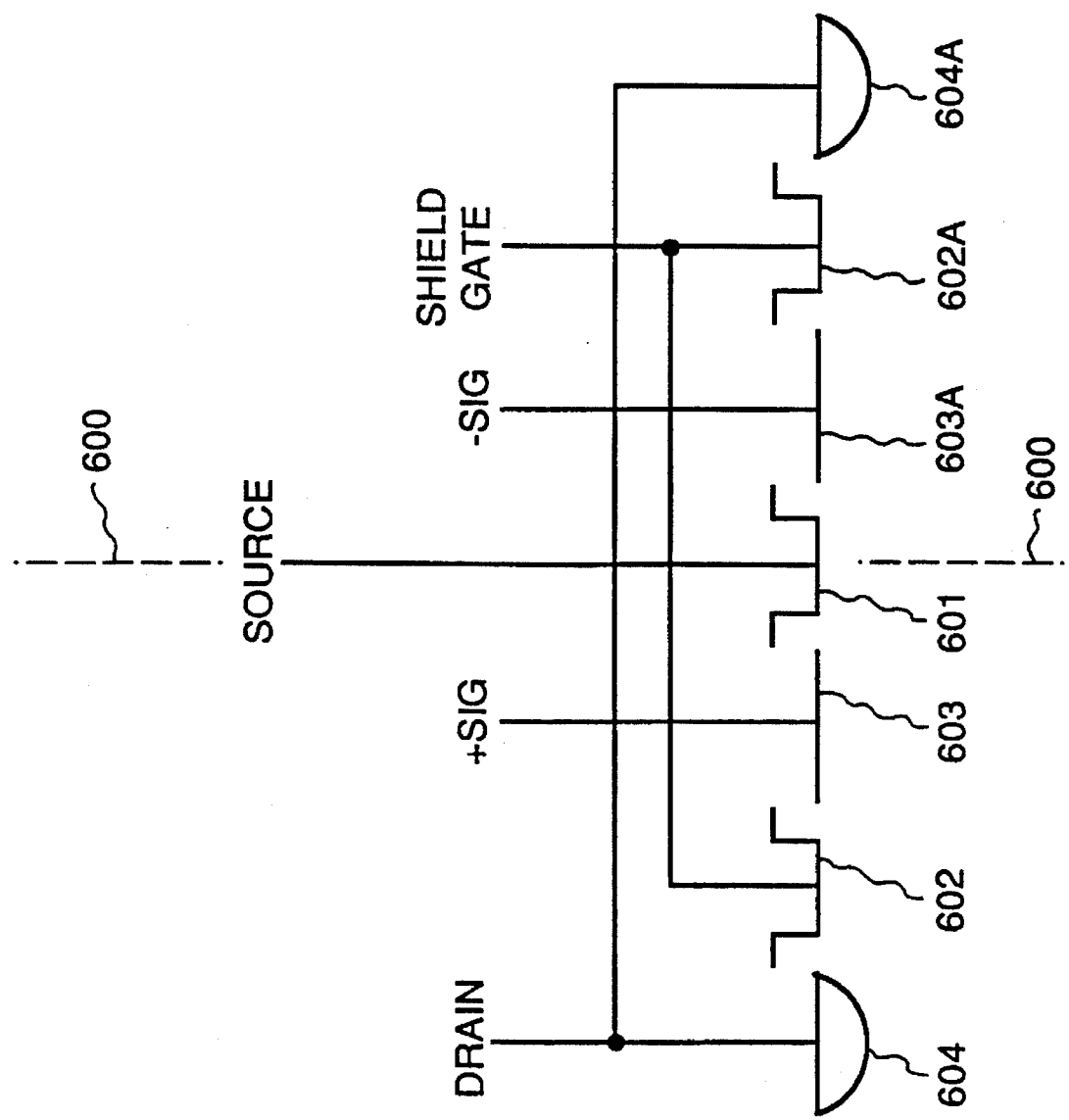
FIG. 6 schematically depicts the full wave version of the shelf transistor structure contemplated by the embodiment of the invention that allows for the separation of input and output functions constrained to be performed on the same conductor utilizing prior art shelf transistor structures.

FIG. 6 illustrates the full wave version of the shelf transistor structure contemplated by the embodiment of the invention that allows for the separation of the input and output functions that are both performed on the same conductor when utilizing prior art shelf transistor structures. This new merged dual shelf transistor structure is fabricated by merging the two structures shown on either side of a line of symmetry 600. Each portion of the merged structure includes (viewing the region to the left of line 600) a diffused region or diffusion 604 serving as both a source and sink of charge, and first, second and third gates 602, 603 and 601, respectively. The first or shield gate 602 shields the second or input gate 603 from voltage transients on the diffusion. The second gate 603, located between third gate 601 and first gate 602, receives an input signal SIG (here positive in polarity as indicated by the "+" symbol) for the shelf gate transistor structure. Third gate 601 is located on the opposite side of second gate 603 in relation to first gate 602, for establishing the reservoir of charge necessary for developing the output signal corresponding to the magnitude of the input signal. The symmetric counterparts of gates 602, 603 and diffusion 604 in the merged structure depicted in FIG. 6, are shown to the right of line 600 as gates 602A, 603A and diffusion 604A respectively. Gate 601 is the common output electrode in the depicted merged structure.

The merged dual shelf transistor structure contemplated by the embodiment of the invention illustrated in FIG. 6 provides the bipolar absolute value output signal at source electrode 601 of the merged structure, and allows the input and output functions to be separated (as compared with conventional dual shelf transistor structures).

The merged dual shelf transistor structure depicted in FIG. 6 provides several advantages over the merged dual shelf transistor structure depicted in FIG. 3. Specifically, since the signal is applied to a gate electrode rather than to the source:

1. The input gate electrode 603, 603A can be of very low capacitance, compared with the source electrode which may need to be large, depending on the conversion gain desired.

2. The drain is only driven; it does not have to be sensed.

3. The source is only sensed; it does not have to be driven.

As a result of these advantages, the output charge can be measured by the current in the shelf transistor source circuit, rather than in the drain circuit. The "gain" factor of the source circuit, in terms of output charge per input voltage change, is the same as the gain factor for the circuit illustrated in FIG. 3 and is approximately proportional to the source electrode capacitance, not the gate electrode capacitance. The polarity of the operation is reversed; that is, an increase in voltage magnitude increases the current, whereas it decreases the current in the implementation of the invention depicted in FIG. 3.

While the aforestated advantages of applying the input signal to an input gate rather than the source are conceptually correct, the finite impedance of a signal source providing the input signal introduces a practical problem; that is, to some extent, the input gate electrode voltage will be dragged up and down along with the drain voltage when the fill-and-spill operations are performed, because of parasitic capacitive coupling between the input gate and the drain. The adverse consequence, for small signals, is that the device can be overspilled; i.e., during spill, the input gate will allow too much charge to flow across. When it recovers, as it will eventually, it will establish a surface potential different than that of the signal source. The effect will be a deadband in the transfer function, for signals smaller than this potential difference. However, the additional gate (the =shield gate) 602, 602A is biased at a "constant" potential, and eliminates the parasitic capacitance between the input gate and the drain. Consequently, the disturbance of the input signal is eliminated, and the deadband is reduced. As used herein, the term constant is an approximation, and the success of this technique depends on how well this constancy can be achieved. It must be expected that it can be quite good, since the shield gate electrode is connected to a source of constant potential, not to an amplifier output voltage.

For example, in the imaging system application taught in the Tomlinson et al. publication, the amplifier output impedance is several megohms, but the impedance of a bias bus would be on the order of a few hundred ohms. If the time constant of the shield electrode is brought below the major response time of the shelf transistor device itself, the finite impedance of the input signal source presents no problem. Moreover, with respect to the merged shelf transistor structure depicted in FIG. 6, it remains possible to use the drain as the readout electrode in the traditional manner, should that prove useful or necessary.

Figure 7:
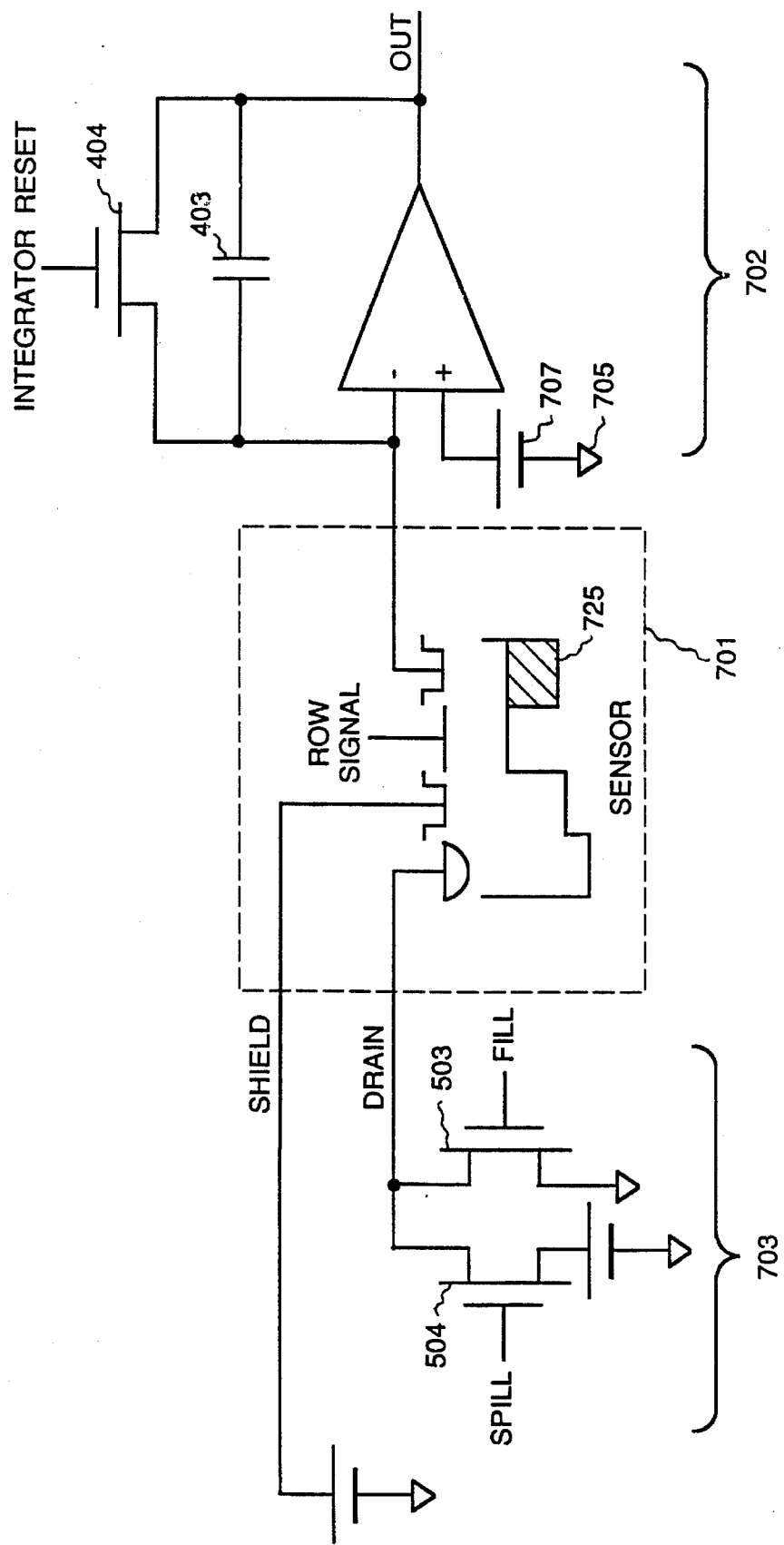
FIG. 7 schematically depicts the external drive and sense or readout circuits combined with the shelf transistor structure (one half of the merged dual structure depicted in FIG. 6) of the invention, which realize the high performance/high speed general absolute value circuit contemplated by the invention.

FIG. 7 illustrates the external drive and sense (readout) circuits combined with the improved rectifying element which constitutes one half 701 of the merged shelf transistor structure depicted in FIG. 6, to realize the high performance/high speed general absolute value circuit contemplated by the invention. The separation of the drive and readout functions is apparent, as compared with these functions being combined by the circuits shown in FIGS. 4 and 5. For the sake of clarity, no CCD structures are shown in rectifying element 701, which is situated on a sensor chip.

Potential wells 725 are shown in FIG. 7 ready for readout of a given term. It should be noted that the readout circuitry 702 for the improved rectifying element 701 corresponds to the resettable integrator of FIG. 4, but with a fixed voltage 707 at its positive input.

Drive circuitry 703 has the same fill-and-spill control structure (comprised of transistors 504 and 503) as the apparatus shown and described hereinabove with reference to FIG. 5; however, transistor 505 employed in the circuit of FIG. 5 is replaced by rectifying element 701. Similar drive circuitry is employed for the other half (not shown) of the merged shelf transistor structure corresponding to rectifying element 701.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An imaging system having a focal plane, said system comprising:

at least one sensor chip located in said focal plane for sensing electromagnetic radiation focused on said chip and storing on said chip a charge proportional to the amount of radiation sensed; and a focal plane processing array located on said sensor chip, including at least one pixel processor responsive to an input charge signal developed from charge stored on said chip, said pixel processor including a general absolute value circuit for developing a bipolar absolute value output signal from said input charge signal, wherein said general absolute value circuit comprises:

a merged dual shelf transistor structure; and a balanced differential amplifier coupled to said merged dual shelf transistor structure for driving said merged dual shelf transistor structure in response to said input charge signal, said merged dual shelf transistor structure being adapted to generate said bipolar absolute value output signal in response to said input charge signal.

2. Apparatus as set forth in claim 1 wherein said merged dual shelf transistor structure comprises a merged structure of elements of two transistors.

3. An imaging system as set forth in claim 1 including drive circuitry coupled to said balanced differential amplifier and adapted to control operation of said merged dual shelf transistor structure.

* * * * *